(12) United States Patent
Lin et al.

(10) Patent No.: US 7,866,043 B2
(45) Date of Patent: Jan. 11, 2011

(54) METHOD OF FLATTING EVAPORATING SECTION OF HEAT PIPE EMBEDDED IN HEAT DISSIPATION DEVICE

(75) Inventors: Kuo-Len Lin, Wugu Township, Taipei County (TW); Wen-Jung Liu, Wugu Township, Taipei County (TW); Chih-Hung Cheng, Wugu Township, Taipei County (TW); Ken Hsu, Wugu Township, Taipei County (TW)

(73) Assignees: Golden Sun News Techniques Co., Ltd., Taipei (TW); CPUMATE Inc., Taipei (TW)

( * ) Notice: Subject to any disclaimer, the term of this patent is extended or adjusted under 35 U.S.C. 154(b) by 346 days.

(21) Appl. No.: 12/110,438

(22) Filed: Apr. 28, 2008

(65) Prior Publication Data
US 2009/0266522 A1  Oct. 29, 2009

(51) Int. Cl.
*B21D 53/02* (2006.01)
*B23P 6/00* (2006.01)

(52) U.S. Cl. ............... 29/890.032; 165/80.3; 165/80.4; 165/104.33; 165/185; 361/700; 257/715; 257/722

(58) Field of Classification Search ............... 165/80.4, 165/104.26, 104.33, 80.3, 185; 361/700, 361/704; 257/715, 722; 29/890.032
See application file for complete search history.

(56) References Cited

U.S. PATENT DOCUMENTS

| | | | | |
|---|---|---|---|---|
| 6,102,110 | A * | 8/2000 | Julien et al. | 165/104.33 |
| 6,394,175 | B1 * | 5/2002 | Chen et al. | 165/80.3 |
| 6,853,555 | B2 * | 2/2005 | Fichera et al. | 361/700 |
| 7,117,930 | B2 * | 10/2006 | Todd et al. | 165/104.21 |
| 7,140,422 | B2 * | 11/2006 | Malone et al. | 165/104.33 |
| 2003/0218849 | A1 * | 11/2003 | Mochizuki et al. | 361/103 |
| 2004/0201963 | A1 * | 10/2004 | Garner | 361/700 |
| 2007/0261244 | A1 * | 11/2007 | Cheng et al. | 29/890.03 |

* cited by examiner

*Primary Examiner*—John K Ford
(74) *Attorney, Agent, or Firm*—Chun-Ming Shih; HDLS IPR Sevices

(57) ABSTRACT

A method of flatting evaporating section of a heat pipe embedded in a heat dissipation device includes the following steps: (a) providing at least a heat pipe and a base of the heat dissipation device to be thermally connected with the heat pipe, the base defining at least a groove for embedding the heat pipe therein; (b) positioning an evaporating section of the heat pipe on the groove of the base; (c) pressing the evaporating section of the heat pipe to embed the evaporating section into the groove of the base with a partial uneven surface of the evaporating section protruding out of the base; (d) flatting the protruded uneven surface of the evaporating section by polishing.

4 Claims, 7 Drawing Sheets

METHOD OF FLATTING EVAPORATING SECTION OF HEAT PIPE EMBEDDED IN HEAT DISSIPATION DEVICE

BACKGROUND

1. Technical Field

The present invention is related to a method of manufacture heat dissipation device, and particularly to a heat dissipation device with heat pipe and a method of flatting an evaporating section of the heat pipe thereof.

2. Description of the Related Art

During operation of an electronic device, a large amount of heat is always produced. The heat must be quickly removed from the electronic device to prevent it from becoming unstable or being damaged. Typically, a heat dissipation device is attached to an outer surface of the electronic device to absorb heat from the electronic device. The heat absorbed by the heat dissipation device is then dissipated to ambient air.

Conventionally, a heat dissipation device comprises a solid metal base attached on the electronic device, and a plurality of fins arranged on the base. The base is intimately attached on the electronic device thereby absorbing the heat generated by the electronic device. Most of the heat accumulated at the base is transferred firstly to the fins and then dissipated out of the fins. However, since the electronics technology continues to advance, amount of the heat generated by the electronic devices increases enormously. Many conventional heat dissipation devices are no longer able to efficiently remove heat from these electronic devices.

In order to overcome the above disadvantages of the heat dissipation device, one type of heat dissipation device used for the electronic device includes a heat pipe which is embedded in the base of the heat dissipation device and the heat can be quickly transferred from a position to another position of the heat dissipation device. A heat pipe is a vacuum-sealed pipe that is filled with a phase changeable fluid, usually being a liquid, such as water, alcohol, acetone and so on, and has an inner wall thereof covered with a capillary configuration. As the electronic device heats up, a hot section typically called an evaporating section of the heat pipe, which is located close to the electronic device, also heats up. The liquid in the evaporating section of the heat pipe evaporates and the resultant vapor reaches a cool section typically called a condensing section of the heat pipe and condenses therein. Then the condensed liquid flows to the evaporating section along the capillary configuration of the heat pipe. This evaporating/condensing cycle repeats and since the heat pipe transfers heat so efficiently, the evaporating section is kept at or near the same temperature as the condensing section of the heat pipe. Correspondingly, heat-transferring capability of the heat dissipation device including such the heat pipe is improved greatly.

In order to make the evaporating section of the heat pipe thermally engaged with the electronic device in a surface to surface manner, the evaporating section needs to be flatted and coplanar with a bottom surface of the base of the heat dissipation device. However, as the heat pipe is embedded in the base, it is difficult to make the evaporating section of the heat pipe so flatted to be coplanar with the bottom surface of the base of the heat dissipation device. As a result, when the heat dissipation device is used in the electronic device, it is difficult to make sure which one of the evaporating section of the heat pipe and the base of the heat dissipation device thermally contacts with the electronic device.

What is needed, therefore, is a heat dissipation device with a heat pipe which is capable to overcome the above described problem.

BRIEF SUMMARY

The present invention provides a method of flatting an evaporating section of a heat pipe embedded in a heat dissipation device and the heat dissipation device with heat pipe. The method makes the evaporating section of the heat pipe protruding out of a base of the heat dissipation device. Such that, when the heat dissipation device contacts with an electronic device, the evaporating section of the heat pipe can function as a direct thermal contacting portion. Thus, high heat conductivity of the heat pipe is effectively utilized. Accordingly, the importance of the base in heat conductive is reduced. As a result, it is not necessary to make the base using high heat conductivity material. The cost of the heat dissipation device is therefore decreased.

A method of flatting evaporating section of a heat pipe embedded in a heat dissipation device includes the following steps: (a) providing at least a heat pipe and a base of the heat dissipation device to be thermally connected with the heat pipe, the base being defined at least a groove for embedding the heat pipe therein; (b) positioning an evaporating section of the heat pipe on the groove of the base; (c) pressing the evaporating section of the heat pipe to embed the evaporating section into the groove of the base with a partial uneven surface of the evaporating section protruding out of the base; and (d) flatting the protruded uneven surface of the evaporating section by polishing.

A heat dissipation device with heat pipe including a base having a groove defined therein; a heat pipe having an evaporating section and a condensing section, the evaporating section being embedded in the groove of the base and having a flatted surface extruding out of the base; and a number of fins cooperatedly defined at least a passageway therein, the condensing section of the heat pipe being received in the passageway of the fins and thermally engaged with the fins at the edges of the passageway.

Other objectives, features and advantages of the present handle structure will be further understood from the further technological features disclosed by the embodiments of the present handle structure wherein there are shown and described preferred embodiments of this handle structure, simply by way of illustration of modes best suited to carry out the present invention.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION OF THE EMBODIMENT

Figure 1:
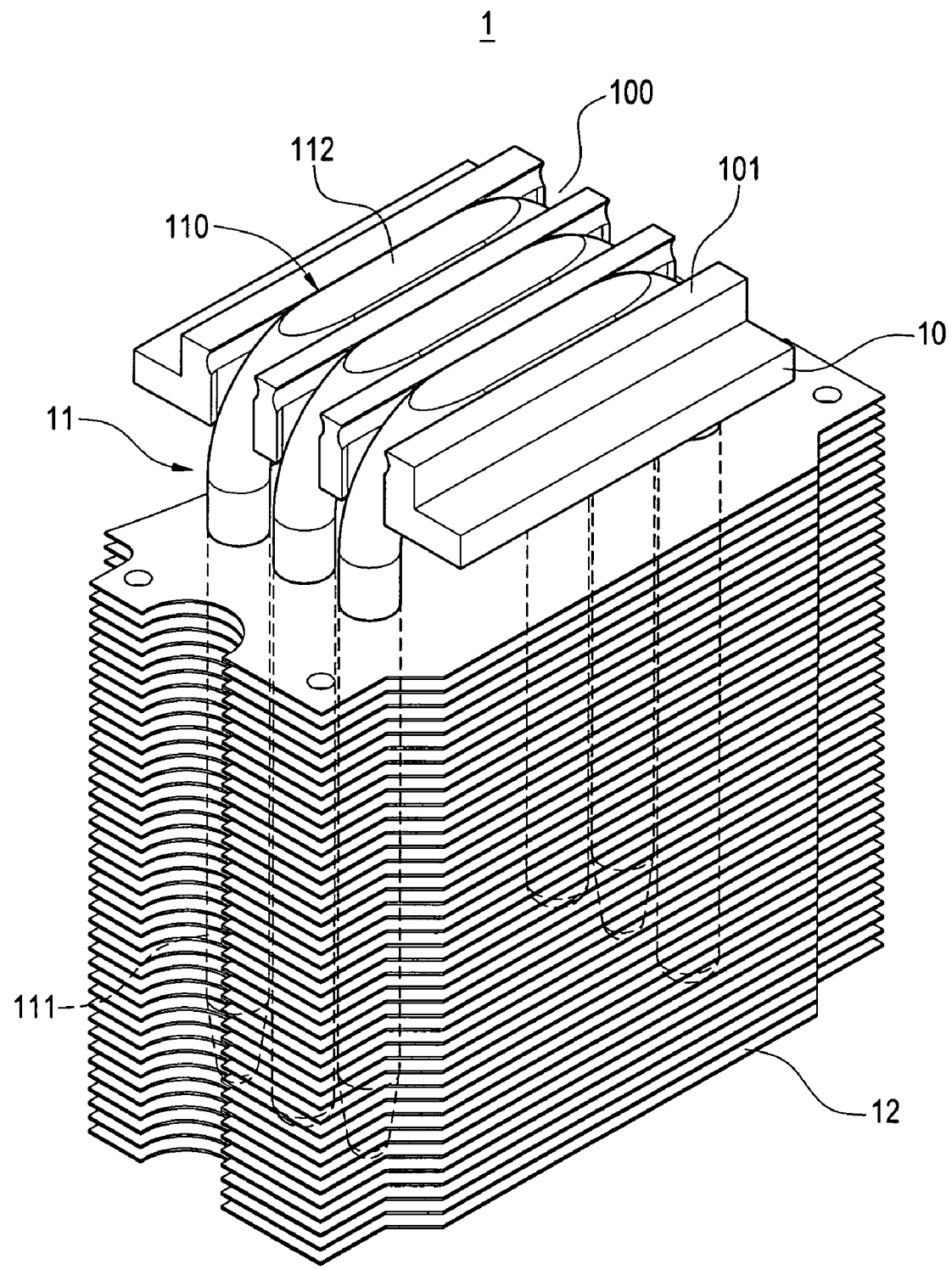
FIG. 1 is a schematic isometric view of a heat dissipation device with heat pipe in accordance with an exemplary embodiment.

These and other features and advantages of the various embodiments disclosed herein will be better understood with respect to the following description and drawings, in which like numbers refer to like parts throughout, and in which:

Referring to FIG. 1, a schematic isometric view of a heat dissipation device with heat pipe in accordance with an exemplary embodiment is shown. The heat dissipation device 1 includes a base 10, at least one heat pipe 11, and a number of fins 12.

The base 10 defines at least one groove 100 in a bottom surface 101 thereof for the heat pipe 11 being embedded therein.

Each heat pipe 11 includes a heat evaporating section 110 and a condensing section 111. In this embodiment of the present invention, each heat pipe 11 has a U-shaped structure. Such that the heat evaporating section 110 is positioned at the middle portion of the U-shaped heat pipe 11 and the condensing section 111 is positioned at each of two ends of the U-shaped heat pipe 11. The heat evaporating section 110 of the heat pipe 11 is embedded in the corresponding groove 100 of the base 10.

The fins 12 are spaced to each other and cooperatedly define at least a passageway (not labeled) therein. The condensing section 111 of the heat pipe 11 is received in the passageway of the fins 12 and thermally engaged with the fins 12 at the edge of the passageway.

Figure 2:
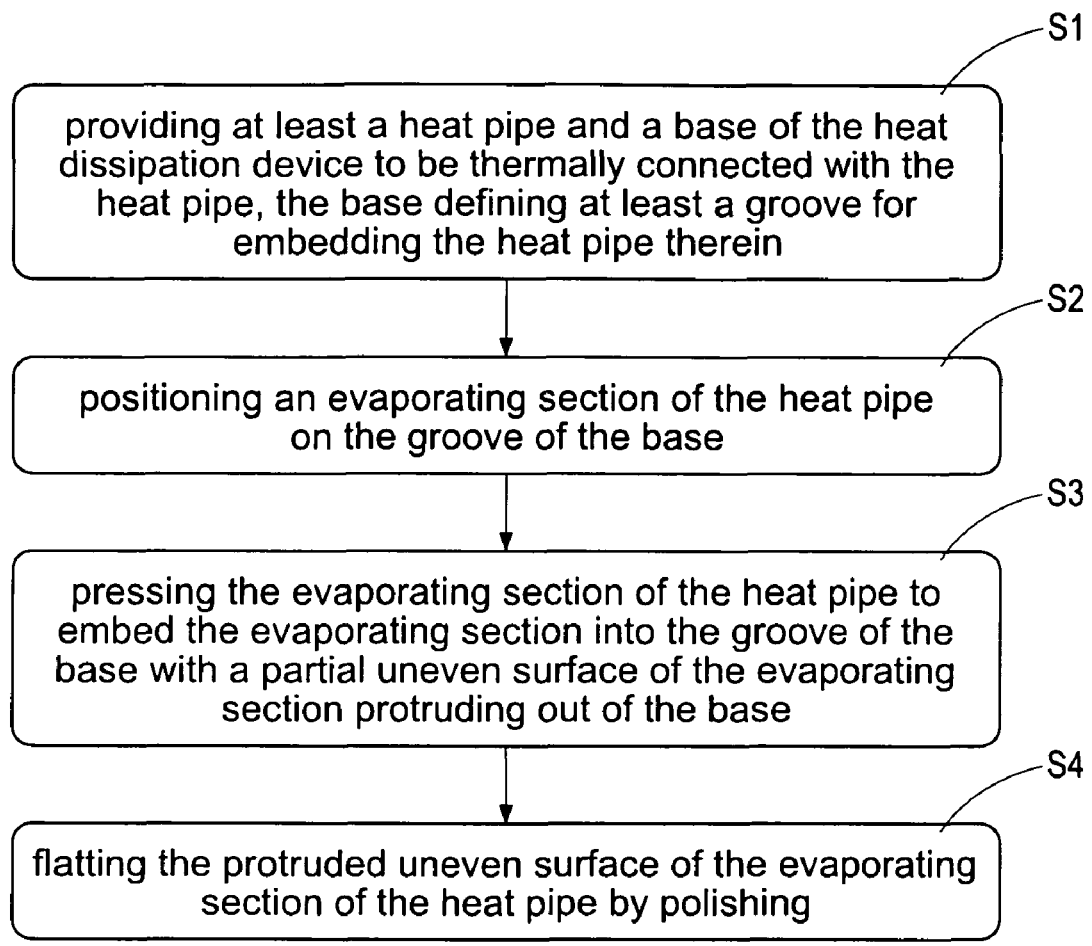
FIG. 2 is a flow chart of a method of flatting an evaporating section of the heat pipe of FIG. 1.

Referring to FIG. 2, a method of flatting the evaporating section 110 of the heat pipes 11 of the heat dissipation device 1 includes the following steps.

Step S1 (referring to FIG. 2): providing at least one heat pipe 11 and the base 10 configured for being thermally connected with the heat pipe 11. The base 10 has the groove 100 defined in the bottom surface 101 thereof for embedding the heat pipe 11 therein.

Figure 3:
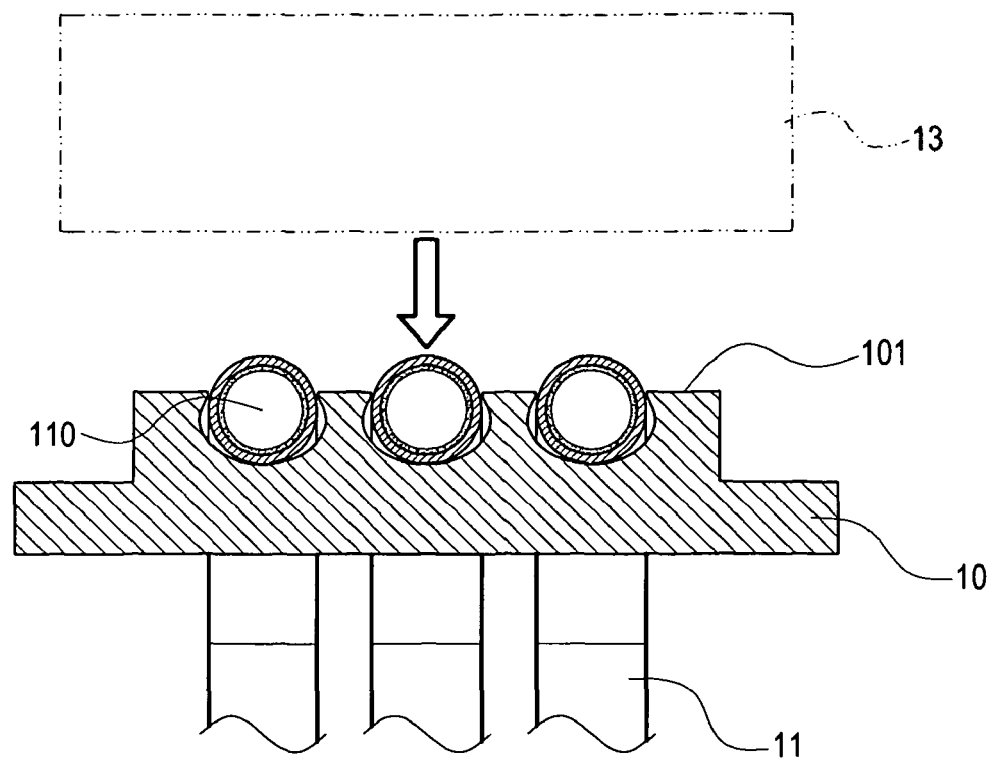
FIG. 3 is a schematic view for illustrating the step S2 of the method of FIG. 2.

Step S2 (referring to FIGS. 2 and 3): positioning the evaporating section 110 of the heat pipe 11 on the groove 100 of the base 10. The inner wall of the groove 100 may be coated with a heat conductive medium, such as heat conductive paste for enhancing thermal contacting between the heat pipe 11 and the inner wall of the groove 100 when the heat pipe 1 is pressed to be deformed and embedded into the groove 100. The groove 100 has an opening 102 configured for embedding the heat pipe 11 therefrom. The diameter of the heat pipe 11 is slightly larger than the depth of the groove 100 and the width of the opening of the groove 100.

Figure 4:
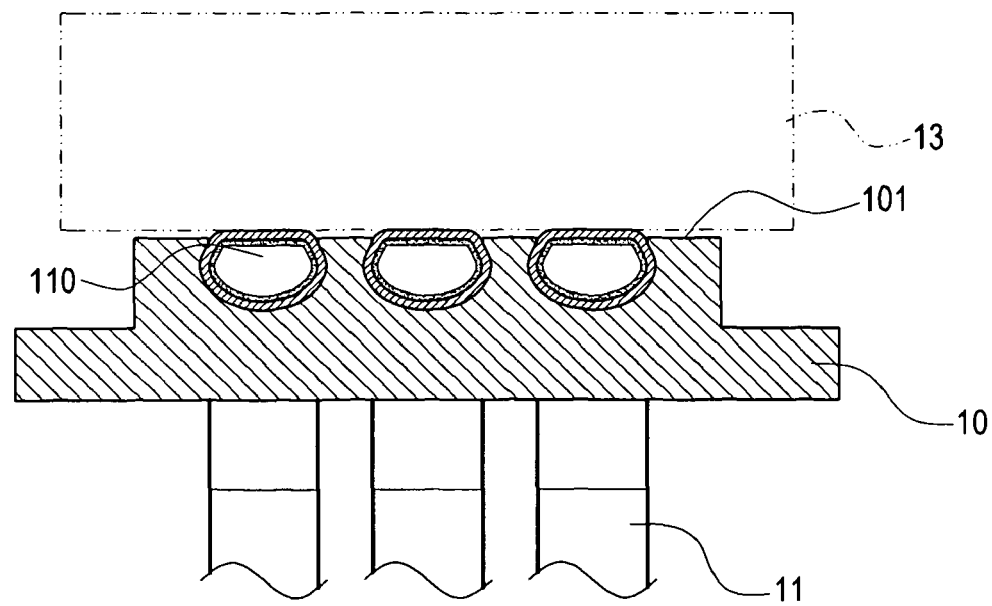
FIG. 4 is a schematic view for illustrating of the step S3 of the method of FIG. 2.

Step S3 (referring to FIGS. 2 and 4): pressing the evaporating section 110 of the heat pipe 11 via a pressing mold 13 to embed the evaporating section 110 of the heat pipe 11 into the groove 100 of the base 10. Due to the diameter of the heat pipe 11 is larger than the width of the opening of the groove 100 and the depth of the groove 100, a partial uneven surface 112 of the evaporating section 110 is protruded out of the bottom surface 101 of the base 10 after the heat pipe 11 is pressed in the groove 100.

Figure 5:
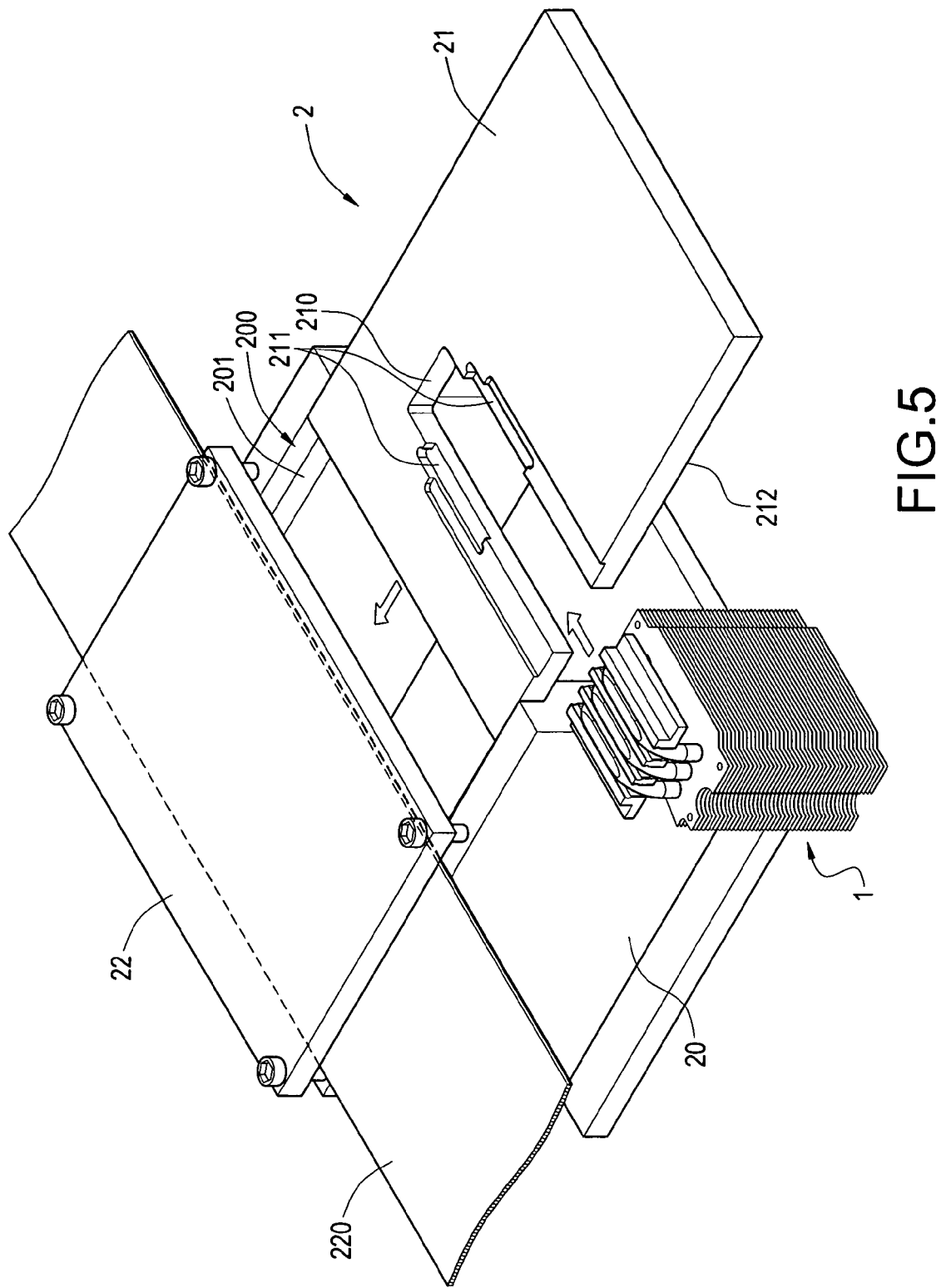
FIG. 5 is a schematic isometric view of polishing according to the exemplary embodiment.

Step S4: flatting the protruded uneven surface 112 of the evaporating section 110 by polishing. Referring to FIG. 5, in the present embodiment, the flatting step is performed by a polishing device 2. The polishing device 2 includes a working station 20, a fixing board 21 and a flatting unit 22.

The working station 20 defines a sliding groove 200 configured for sliding the fixing board 21 into the working station 20 therefrom. A receiving groove 210 is defined at the fixing board 21. A concave 211 is defined in the receiving groove 210 configured for fixing the heat dissipation device 1 thereon. In order to match the position of the flatting unit 22, the heat dissipation device 1 is fixed on the concave 211 in an inverted manner. That is, the base 10 of the heat dissipation device 1 is fixed on the concave 211. In assembly, the inverted heat dissipation device 1 is firstly positioned on the concave 211 via the receiving groove 210 of the fixing board 21. The fixing board 21 with the inverted heat dissipation device 1 fixed thereon is slid into the working station 20 via the sliding groove 200. Thereby, the protruded uneven surface 112 of the evaporating section 110 of the heat pipe 11 is positioned to face the flatting unit 22.

Figure 6:
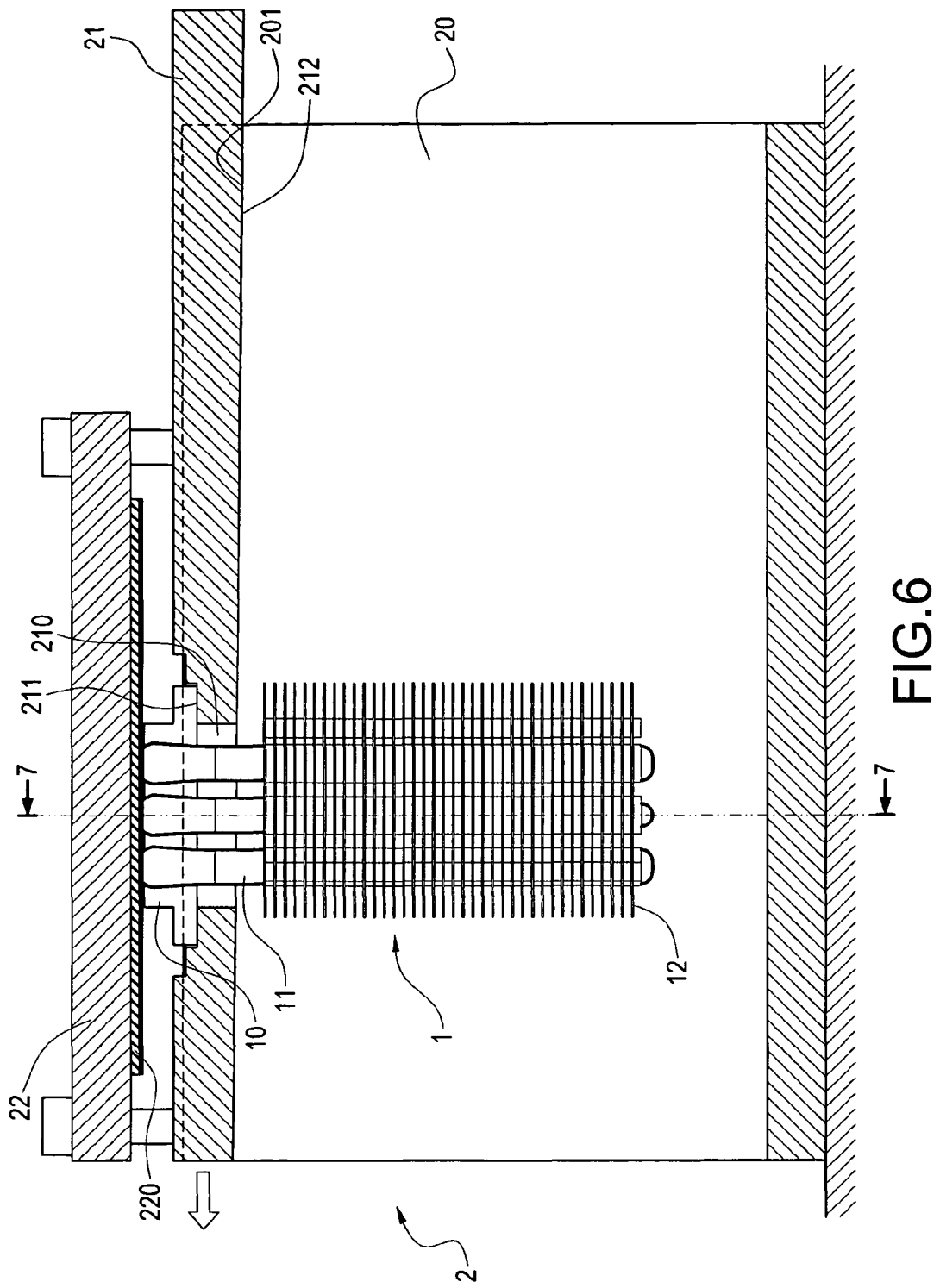
FIG. 6 is a schematic assembled view of polishing according to the exemplary embodiment.

Referring to FIG. 6, a supporting surface 201 is defined in the sliding groove 200, which leans against the bottom surface 212 of the fixing board 21. Such that, the fixing board 21 can be conveniently slid into the working station 20 gradually from the wide side into the narrow side.

Figure 7:
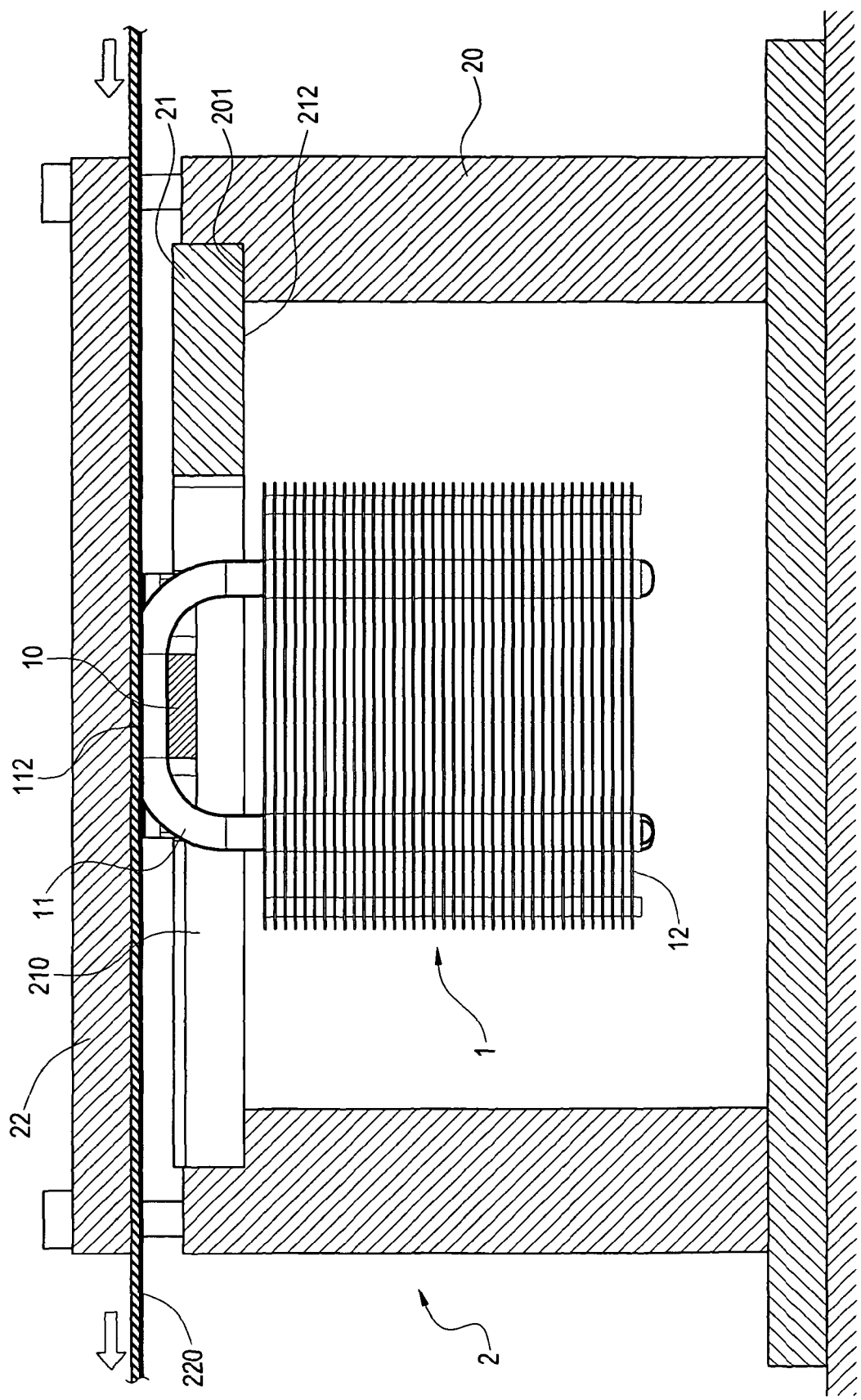
FIG. 7 is a cross-sectional view of polishing of FIG. 6 taken alone VII-VII line.

Referring to FIG. 7, when the fixing bard 21 enters into the working station 20 and is fixed, the protruded uneven surface 112 of the evaporating section 110 of the heat pipe 11 contacts with a polishing strip 220 of the flatting unit 22. Then the uneven surface 112 of the evaporating section 110 of the heat pipe 11 is polished to be a flat surface by the polishing strip 220 of the flatting unit 22.

Figure 8:
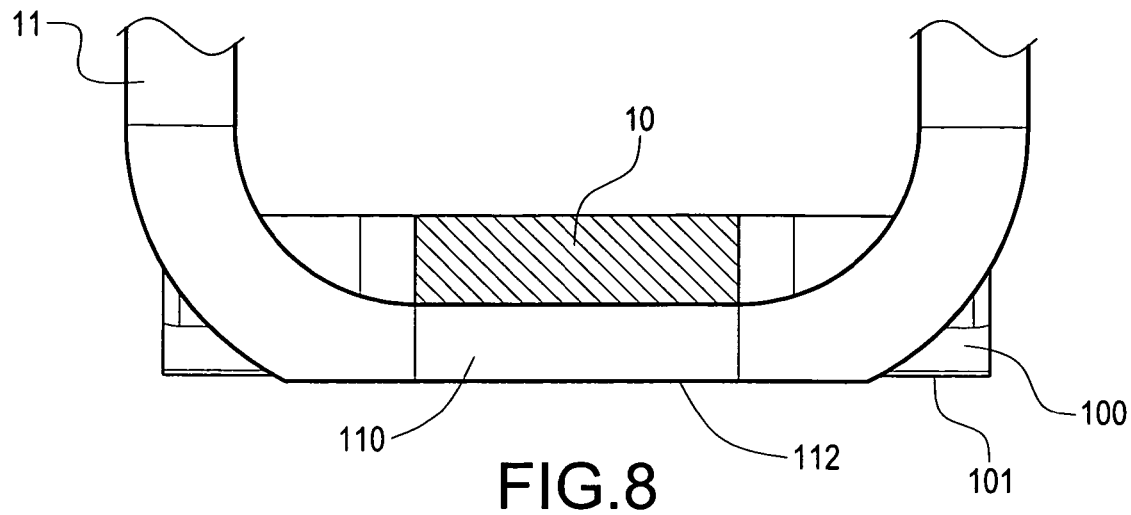
FIG. 8 is a partially schematic view of the heat dissipation device with heat pipe of FIG. 1 after being flatted.
Figure 9:
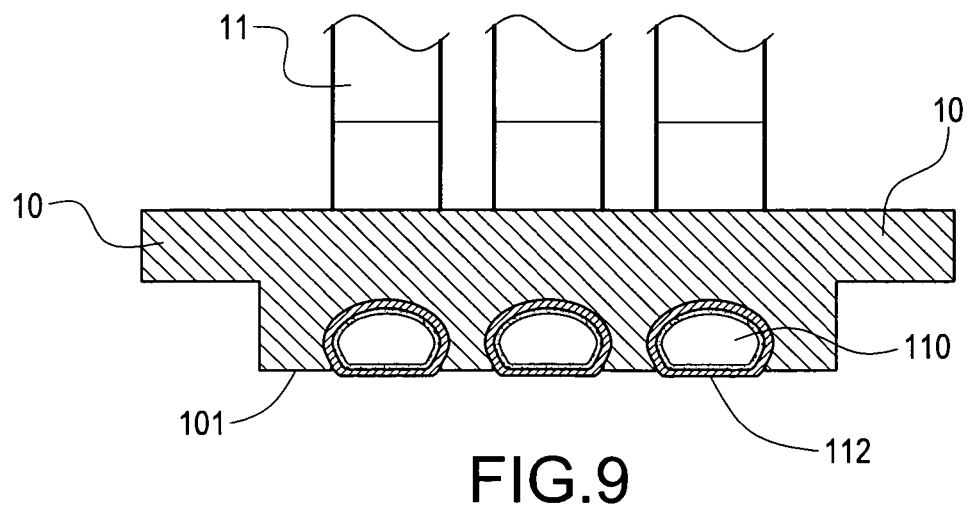
FIG. 9 is a partially schematic view of the heat dissipation device with heat pipe of FIG. 1 after being flatted from another angle.

Referring to FIGS. 8 and 9, the flatted surface 112 of the evaporating section 110 of the heat pipe 11 is extruded out of the bottom surface 101 of the base 10. In another word, the flatted surface 112 of the evaporating section 110 of the heat pipe 11 and the bottom surface 101 of the base 10 are not coplanar. Thus, when the heat dissipation device 1 contacts with the electronic device, the evaporating section 110 of the heat pipe 11 can function as a direct thermal contacting portion. Therefore, the high heat conductivity of the heat pipe 11 is effectively utilized. Accordingly, the importance of the base 10 in heat conductive is reduced. In addition, it is not necessary to make the base 10 using high heat conductivity material. The cost of the heat dissipation device 1 is therefore decreased.

The above description is given by way of example, and not limitation. Given the above disclosure, one skilled in the art could devise variations that are within the scope and spirit of the invention disclosed herein, including configurations ways of the flatting method of the heat dissipation device and the heat dissipation device and/or designs of the flatting method of the heat dissipation device and the heat dissipation device. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A method of flatting evaporating section of a heat pipe embedded in a heat dissipation device, the method comprising the following steps:

providing at least a heat pipe and a base and a plurality of fins of the heat dissipation device to be thermally connected with the heat pipe, the base defining at least a groove for the heat pipe being embedded therein;

positioning an evaporating section of the heat pipe on the groove of the base and engaging a condensing section of the heat pipe with the fins;

pressing the evaporating section of the heat pipe to embed the evaporating section into the groove of the base with a partial uneven surface of the evaporating section protruding out of the base;

flatting the protruded uneven surface of the evaporating section of the heat pipe by polishing performed with a polishing device including a working station, a fixing board, and a flatting unit, the working station defining a sliding groove configured for sliding the fixing board into the working station therefrom, the fixing board defining a receiving groove and a concave being defined in the receiving groove configured for fixing the base of the heat dissipation device, which further includes the steps of:

positioning the base of the heat dissipation device on the concave via the receiving groove of the fixing board; and sliding the fixing board with base of the heat dissipation device fixed thereon into the working station via the sliding groove for making the protruded uneven surface of the evaporating section of the heat pipe facing the flatting unit.

2. The method of claim 1, further comprising coating a heat conductive medium on the inner wall of the groove of the base before positioning the evaporating section of the heat pipe on the groove of the base.

3. The method of claim 2, wherein the heat conductive medium is heat conductive paste.

4. The method of claim 1, wherein a supporting surface is defined in the sliding groove which leans against a bottom surface of the fixing board for sliding the fixing board into the working station gradually from a wide side to a narrow side.

* * * * *